(12) United States Patent
Gao et al.

(10) Patent No.: US 8,022,495 B2
(45) Date of Patent: Sep. 20, 2011

(54) PIN DIODE STRUCTURE WITH ZINC DIFFUSION REGION

(75) Inventors: Xiang Gao, Edison, NJ (US); Alex Ceruzzi, Princeton Junction, NJ (US); Linlin Liu, Hillsborough, NJ (US); Stephen Schwed, Bridgewater, NJ (US)

(73) Assignee: Emcore Corporation, Albuquerque, NM (US)

( * ) Notice: Subject to any disclaimer, the term of this patent is extended or adjusted under 35 U.S.C. 154(b) by 281 days.

(21) Appl. No.: 12/420,213

(22) Filed: Apr. 8, 2009

(65) Prior Publication Data
US 2009/0230497 A1 Sep. 17, 2009

Related U.S. Application Data

(62) Division of application No. 11/230,959, filed on Sep. 19, 2005, now Pat. No. 7,538,403.

(60) Provisional application No. 60/611,152, filed on Sep. 20, 2004.

(51) Int. Cl.
*H01L 31/06* (2006.01)

(52) U.S. Cl. ........ 257/461; 257/458; 257/184; 257/434; 257/E31.061

(58) Field of Classification Search ................... 257/458, 257/459, 461, 434, 184–189, E31.061
See application file for complete search history.

(56) References Cited

U.S. PATENT DOCUMENTS 5,332,919 A * 7/1994 Fujimura ........................ 257/434
6,384,459 B1 * 5/2002 Matsuda ........................ 257/435

FOREIGN PATENT DOCUMENTS

JP 09-181349 7/1997

* cited by examiner

*Primary Examiner* — Matthew Reames

(57) ABSTRACT

A PIN photodiode having a substrate, a first type electrode layer disposed on the substrate, a first layer of intrinsic material disposed over a portion of the first-type electrode layer, and a first type window layer disposed over the intrinsic layer. An island shaped region of intrinsic material is disposed over the window layer and a dielectric layer is disposed over the island region and at least the peripheral portion of said island shaped region whereby an opening is formed in the island shaped region. A dopant is diffused through the opening so as to form a PN junction that extends into the first layer of intrinsic material.

12 Claims, 11 Drawing Sheets

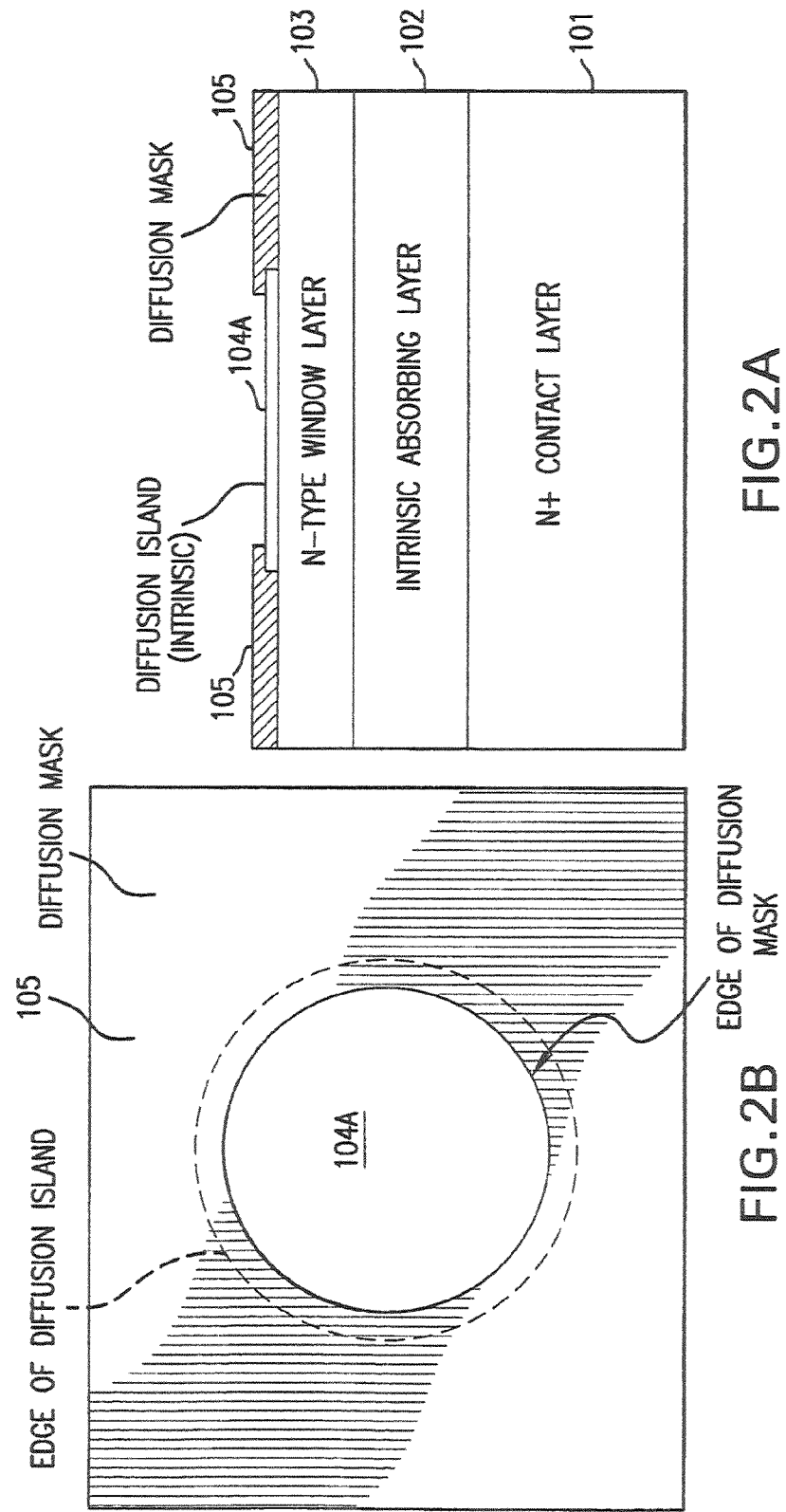

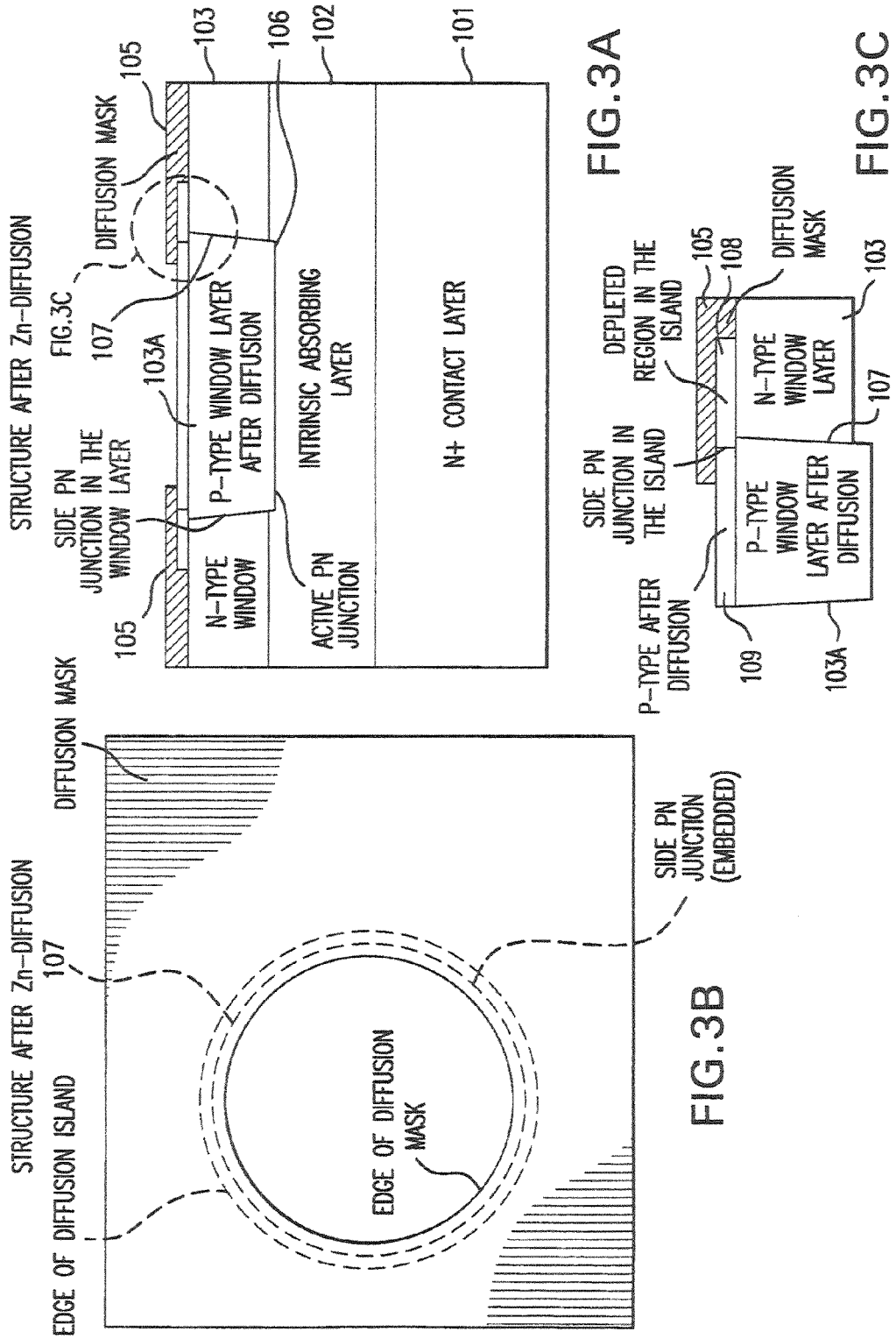

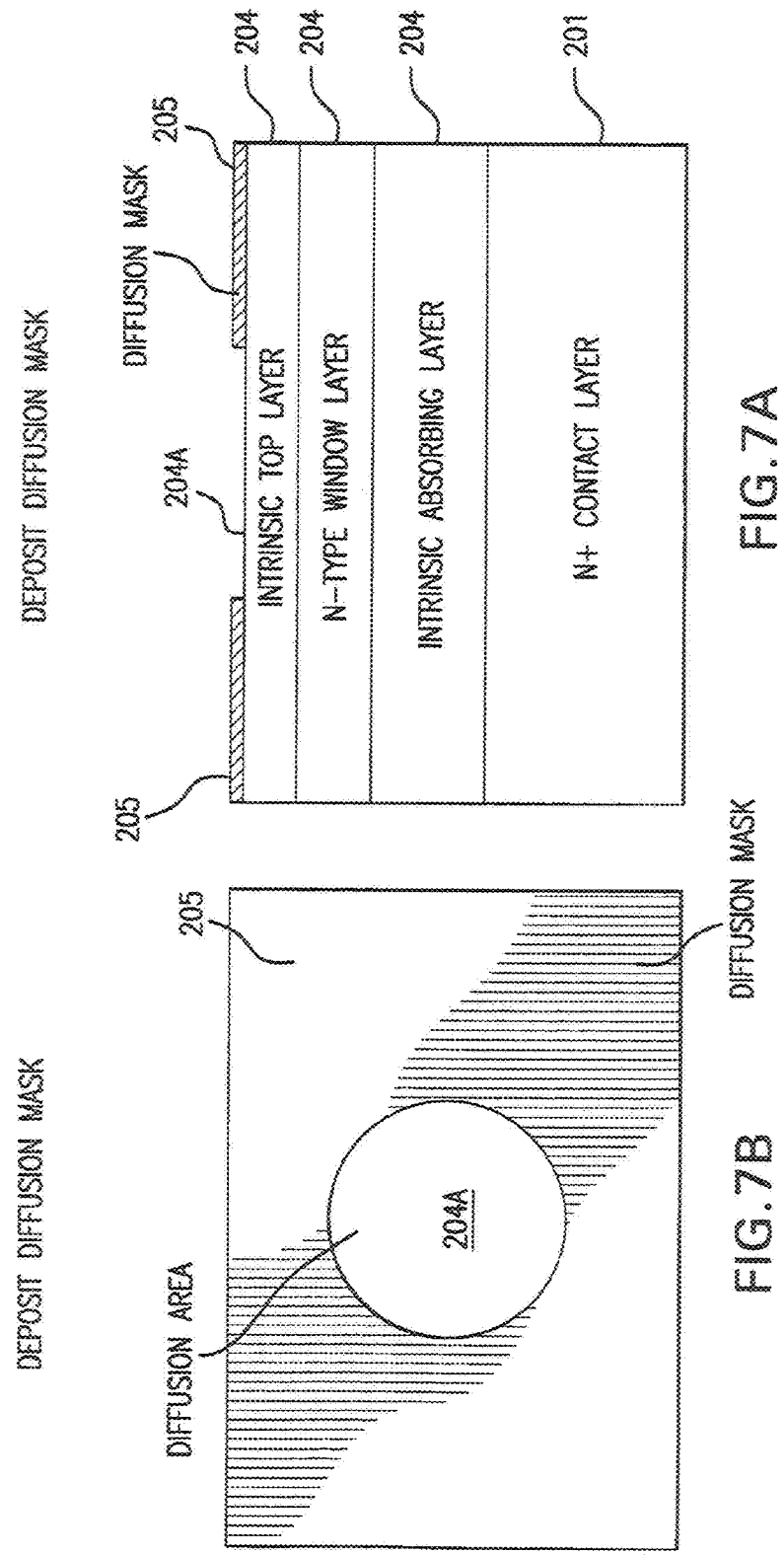

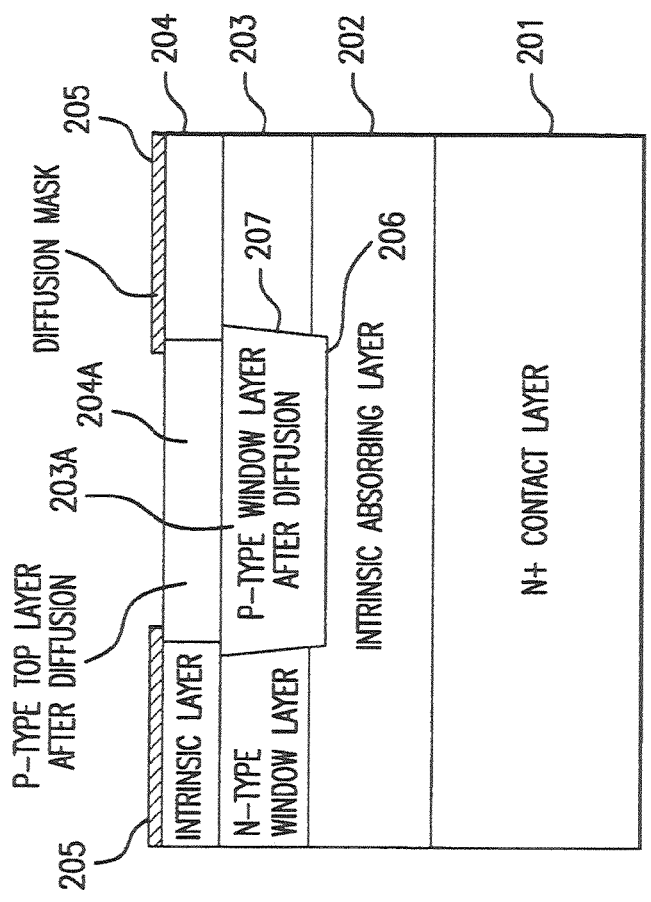
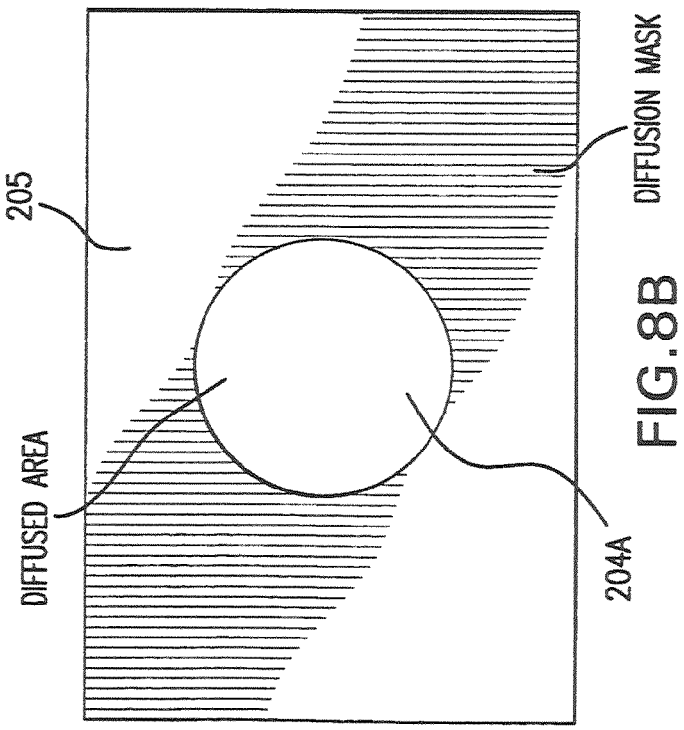

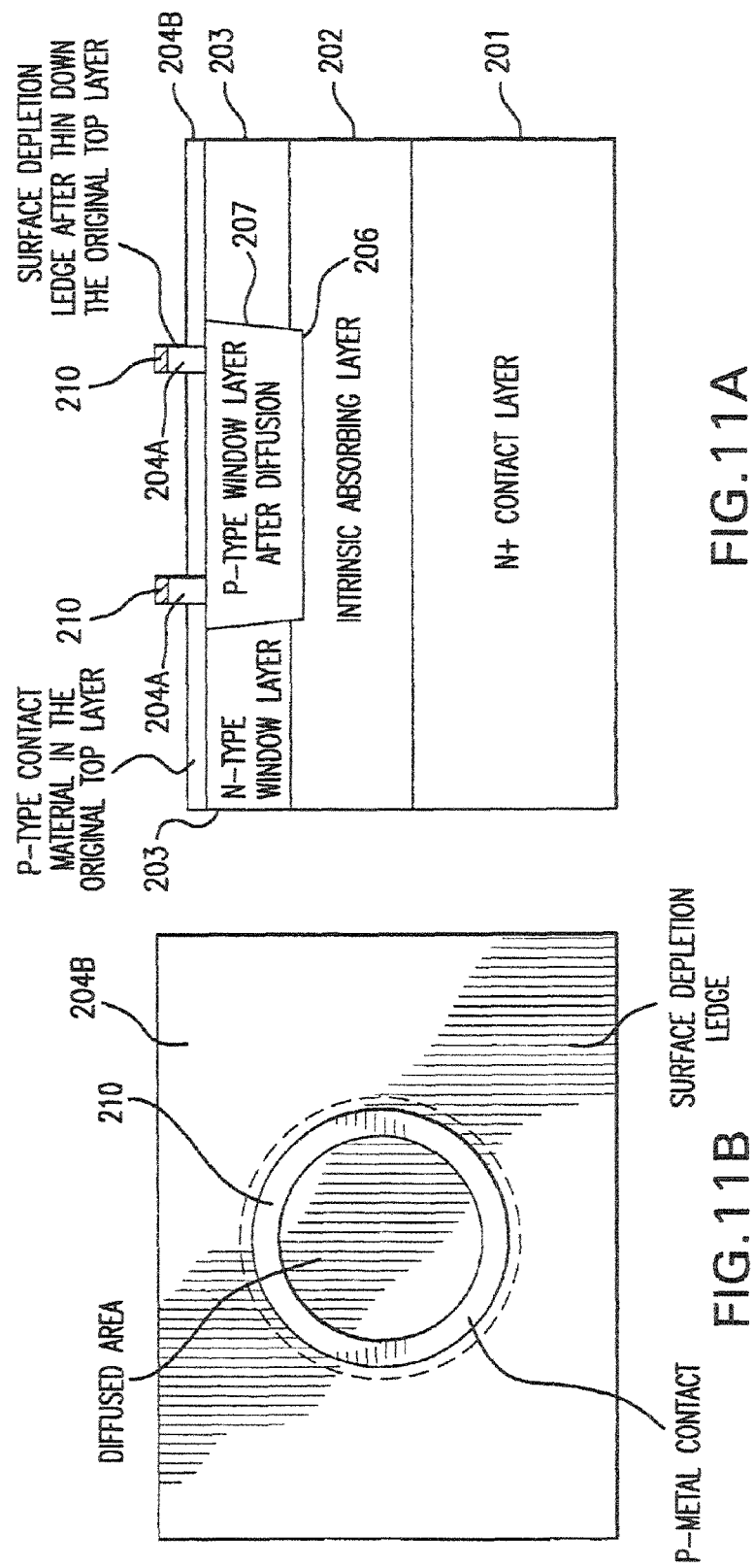

though the opening, extending into the first layer of intrinsic material so as to form a PN junction. A metal electrode is also disposed over the second layer of intrinsic material around the opening in the dielectric layer. The top layer of intrinsic material is etched down so that the layer is depleted due to surface depletion.

PIN DIODE STRUCTURE WITH ZINC DIFFUSION REGION

CROSS-REFERENCE TO RELATED APPLICATION(S)

This application is a divisional of U.S. Ser. No. 11/230,959, filed Sep. 19, 2005, which claims priority to and the benefit of U.S. Provisional Application No. 60/611,152, filed Sep. 20, 2004.

BACKGROUND OF THE INVENTION

1. Field of the Invention

The invention relates generally to PIN photodiodes. More particularly, the invention relates to a PIN photodiode semiconductor structure diode which has high reliability, with extremely low dark current, and suitable to be used in high temperature, high humidity environments, and processes for fabrication of such devices.

2. Description of the Related Art

Fiber optic communications typically employ a modulated light source, such as a laser, a photodiode light detector, and an optical fiber interconnecting the laser and the photodiode. The laser is modulated to emit light pulses that are transmitted over an optical fiber and received at a remote unit that includes a photodiode to convert the optical signal into an electrical signal. In particular, PIN diodes are widely used the photodiodes in the optical receiver for high-speed fiber optics communication. A typical lateral PIN diode fabricated by Zn diffusion has an exposed PN junction on the top surface. Traditionally, the exposed PN junctions on the surface of the devices are covered by dielectric for passivation. However, the dielectric protection often degrades under various reliability test environments such as high temperature, high humidity test (HTHH), etc. One of the most commonly used methods is Zn diffusion, where Zn atoms are diffused through a window layer and forms an active PN junction just inside the absorbing layer. A typical Zn diffused PIN photodiode will also create a side PN junction on the surface of the window layer, which is also a semiconductor material.

Patterned area Zinc (Zn) diffusion has been widely employed for fabricating InP based high-speed PIN photodiodes. The commonly used epitaxial structure of the photodiode before diffusion is the layer sequence n-InP, intrinsic InGaAs and n++InP 103 (or with an undoped InGaAs top layer). In the traditional process, a dielectric layer is first deposited on top of the InP or the InGaAs layer and diffusion opening formed. The p-type doping is achieved by diffusing the Zn atoms directly (or via InGaAs layer) into the InP layer 103 through the diffusion openings in the dielectric layer. The final structure after diffusion is p-InP 104; Intrinsic InGa 102 and n++InP 101 PIN, which is typical for a PIN photodiode.

One of the drawbacks for the traditional process is that there is an exposed PN junction on the surface of the top InGaAs or InP layer. Without re-depositing a dielectric layer for high quality passivation, the surface recombination current is potentially high, which gives rise to inconsistent operating dark current after fabrication. Even with good initial leakage characteristics, significant degradation of operation dark current often exists after aging, especially under conditions of high temperatures operating live (HTOL) tests of high temperature/high humidity reverse biased tests (THRB), where dielectric protection is normally weak if attacked by corrosion.

Prior to the present invention, there has not been suitable means for protecting the PN junction in a PIN diode fabricated by Zn diffusion without the use of an additional dielectric sealing layer in the PIN photodiode.

SUMMARY OF THE INVENTION

1. Objects of the Invention

It is an object of the present invention to provide an improved semiconductor structure for a PIN photodiode with a zinc diffusion region.

It is another object of the present invention to provide an improved PIN photodiode with a protected PN junction.

It is also another object of the present invention to provide a diffusion island for PIN photodiodes.

It is also an object of the present invention to provide a process to provide a protected PN junction in a PIN photodiode and thereby provide consistent fabrication and reliability of such devices.

Some implementations or embodiments may achieve fewer than all of the foregoing objects.

2. Features of the Invention

Briefly, and in general terms, the present invention provides a PIN photodiode with the following epitaxial structure: a substrate, a first type electrode layer disposed on the substrate, an intrinsic layer disposed over the first type electrode layer, a first type window layer disposed over the intrinsic layer, and an intrinsic layer disposed over the first type window layer.

More particularly, the present invention provides a PIN photodiode having a substrate, a first type electrode layer disposed on the substrate, a first layer of intrinsic material disposed over a portion of the first type electrode layer, a first type window layer disposed over the intrinsic layer, and an island shaped region of intrinsic material disposed over said window layer.

A dielectric layer is disposed over the island region and at least the peripheral portion of the island shaped region whereby an opening is formed in the island shaped region, and a dopant is diffused through the opening so as to form a PN junction that extends into the first layer of intrinsic material.

In a second embodiment, the present invention provides a PIN photodiode having a substrate, a first type electrode layer disposed on the substrate, a first layer of intrinsic material disposed over a portion of the first type electrode layer, a first type window layer disposed over said intrinsic layer, a second type layer of intrinsic material disposed over the second type electrode layer. A dielectric layer is disposed over the second layer of intrinsic material having an opening, and a dopant is diffused through the opening, extending into the first layer of intrinsic material so as to form a PN junction. A metal electrode is also disposed over the second layer of intrinsic material around the opening in the dielectric layer. The top layer of intrinsic material is etched down so that the layer is depleted due to surface depletion.

In another aspect, the present invention provides a processing method step for fabricating a PIN diode including (i) an etching followed by a diffusion step, and (ii) a diffusion step followed by an etching process. Both processes (i) and (ii) result in forming a passivated region in the last intrinsic layer away from the substrate over the PN junction, and a second type electrode layer is disposed over at least a portion of the intrinsic layer so as to form a PN junction. A peripheral passivation layer is disposed over the PN junction on the planar surface of the photodiode and generally surrounding the active region of the photodiode.

Still, another aspect of the present invention is to provide a method of manufacturing a PIN photodiode comprising providing a substrate, forming a first type electrode layer on the substrate, forming an intrinsic layer on the first type electrode layer, forming a first type window layer on the intrinsic layer, forming a second type electrode layer disposed over at least a portion of the intrinsic layer so as to form a PN junction, and depositing a peripheral passivation layer disposed over the PN junction on the planar surface of the photodiode and generally surrounding the active region of the photodiode.

The protection of the PN junction in the PIN diode as a result of the fabrication process of the present invention is a substantial improvement of the PN diode reliability and lifetime, particularly under extreme conditions such as those conditions simulated under testing at 85 degrees Centigrade and 85% humidity conditions.

Some implementations or embodiments may incorporate or implement fewer of the aspects or features noted in the foregoing summaries.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

These and other features and advantages of this invention will be better understood and more fully appreciated by reference to the following detailed description when considered in conjunction with the accompanying drawings, wherein:

FIG. 2A is a cross-sectional view of a lateral PIN photodiode in accordance with the present invention during a first step of the fabrication process;

FIG. 2B is a top plain view of the lateral PIN photodiode of FIG. 2A;

FIG. 3A is a cross-sectional view of a lateral PIN photodiode during the second fabrication step in accordance with the present invention;

FIG. 3B is a top plan view of the lateral PIN photodiode of FIG. 3A;

FIG. 3C is an enlarged cross-sectional view of a portion of the lateral PIN photodiode of FIG. 3A;

FIG. 7A is a cross-sectional view of a lateral PIN photodiode in accordance with a second embodiment of the present invention during a first step of the fabrication process;

FIG. 7B is a top plan view of the lateral PIN photodiode of FIG. 7A;

FIG. 8A is a cross-sectional view of a lateral PIN photodiode of FIG. 7A during the second fabrication step in accordance with the present invention;

FIG. 8B is a top plan view of the lateral PIN photodiode of FIG. 8A;

FIG. 11A is a cross-section view of the lateral PIN photodiode of FIG. 10A during a subsequent processing step; and FIG. 11B is a top plan view of the lateral PIN photodiode of FIG. 11A.

DESCRIPTION OF THE PREFERRED EMBODIMENT

Figure 1:
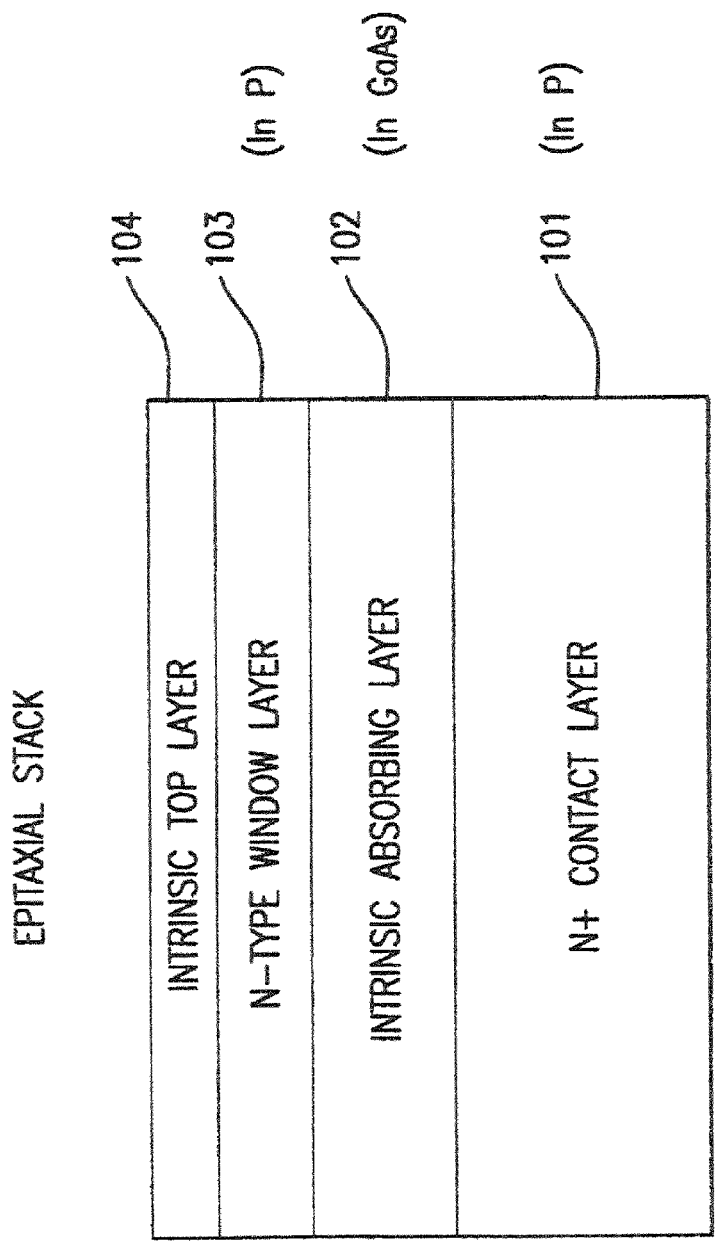
FIG. 1 is a cross-sectional view of the structure of the epitaxial stack of a lateral PIN photodiode construed in accordance with the prior art.

Details of the present invention will now be described, including exemplary aspects and embodiments thereof. Referring to the drawings and the following description, like reference numbers are used to identify like or functionally similar elements, and are intended to illustrate major features of the exemplary embodiments in a highly simplified diagrammatic manner. Moreover, the drawings are not intended to depict every feature of actual embodiments nor the relative dimension of the depicted elements, and are not drawn to scale.

Referring to FIG. 1, there is shown a fragmentary, cross-sectional view of a semi-conductor structure or the epitaxial stack representing the initial layers of a lateral PIN photodiode during the fabrication process of the present invention that is depicted with generic first and second type electrodes. In particular, the photodiode 100 includes an n+ contact layer 101 and an intrinsic absorbing layer 102 disposed on the n+ contact layer. An n-type window layer 103 is disposed on the absorbing layer 102, and an intrinsic layer 103 is disposed on the layer 103. The n+ and n− regions 101 and 103 normally are doped to high carrier concentrations while the intrinsic region 102 typically has a small, residual n type carrier concentration.

FIG. 2A is a cross-sectional view of a lateral PIN photodiode in accordance with the present invention during a first step of the fabrication process. A circular diffusion island 104A is formed on the surface of the semiconductor structure of FIG. 1. A diffusion mask 105 is applied over the entire surface of the wafer surrounding the diffusion island 104A and concentrically overlapping the entire circumferential edge of the island.

FIG. 2B is a top plain view of the lateral PIN photodiode of FIG. 2A, depicting the diffusion mask 105 overlapping the circumferential edge of the diffusion island 104A.

FIG. 3A is a cross-sectional view of a lateral PIN photodiode during the second fabrication step in accordance with the present invention after AN diffusion. A p-type window layer 103A is formed in the n-type window layer 103 below the diffusion island 104A. A pn junction is formed both on the side 107 of the p-type layer 103A, and on the bottom 106 of the layer.

FIG. 3B is a top plan view of the lateral PIN photodiode of FIG. 3A showing the location of the side pn junction 107 being located intermediate the edge of the diffusion island and the edge of the diffusion mask.

FIG. 3C is an enlarged cross-sectional view of a portion of the lateral PIN photodiode of FIG. 3A depicting the region between the diffusion island 104A and the diffusion mask 105 in greater detail. In particular, the portion 109 of the diffusion island which is p-type is depicted, adjourning the depleted region 108 in the island 104A and forming a side pn junction there between.

Figure 4A:
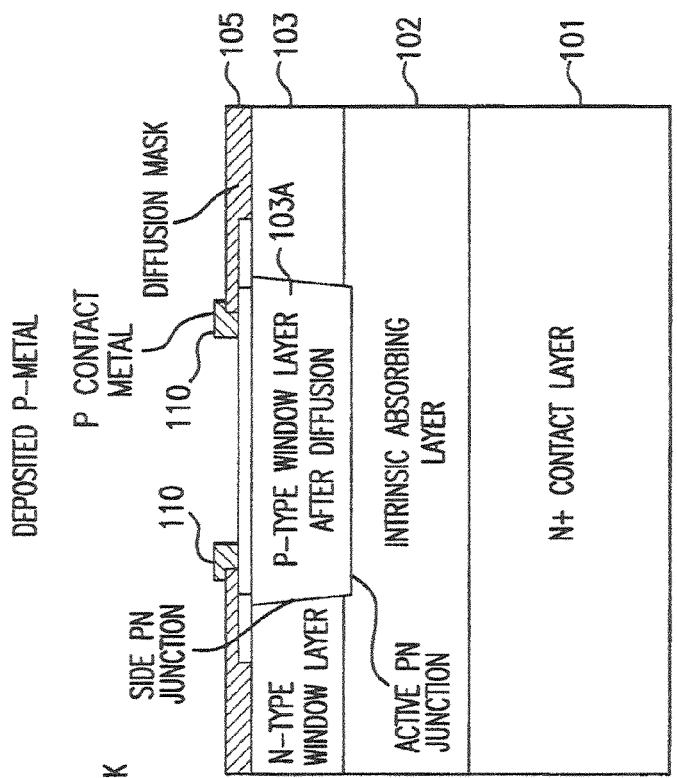
FIG. 4A is a cross-sectional view of the lateral PIN photodiode during a subsequent fabrication step in accordance with the present invention.

FIG. 4A is a cross-sectional view of the lateral PIN photodiode during a subsequent fabrication step in accordance with the present invention in which a p-contact metal ring region is lithographically defined and a contact metal is deposited to form the p-type contact to the device.

Figure 4B:
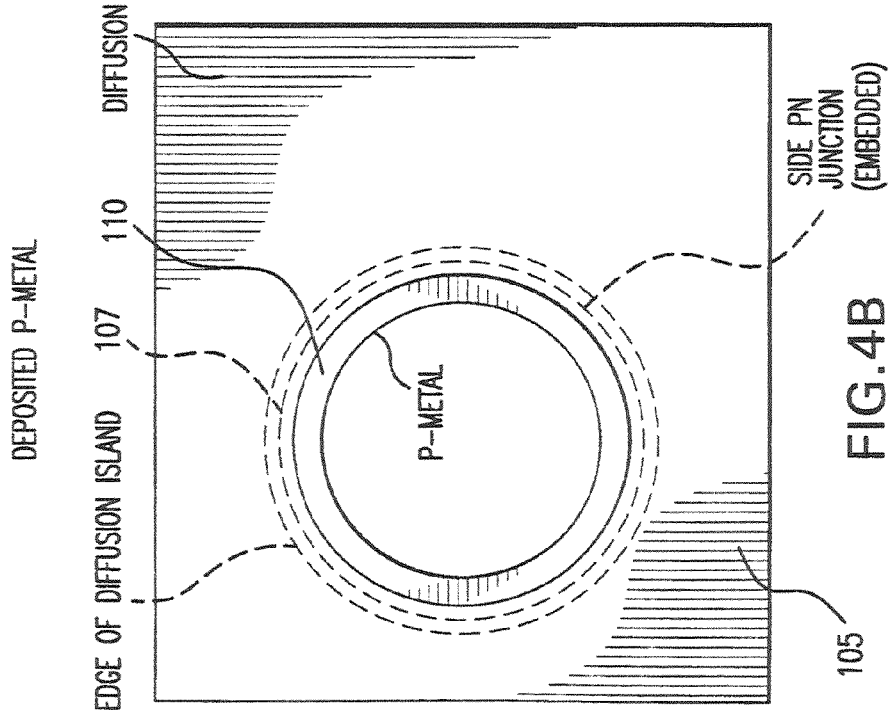
FIG. 4B is a top plan view of the lateral PIN photodiode of FIG. 4A.

FIG. 4B is a top plan view of the lateral PIN photodiode of FIG. 4A depicting the annular p contact metal ring overlying the circumferential edge portion of the diffusion island 104A.

Figure 5A:
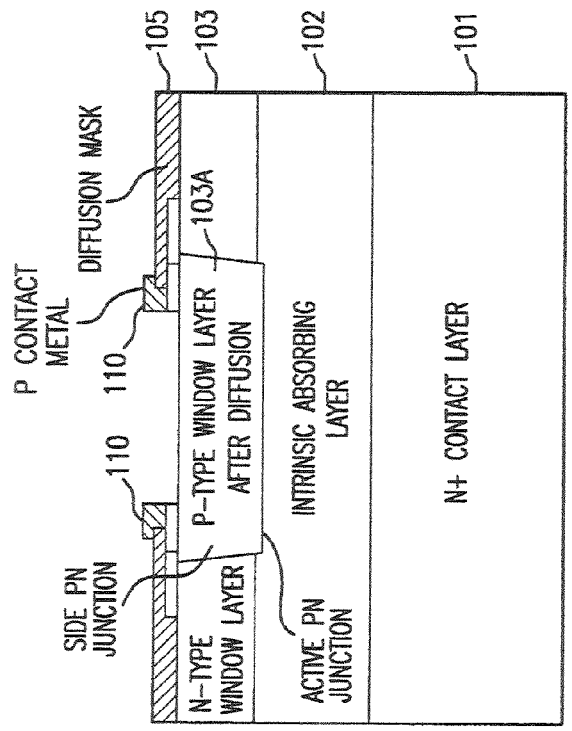
FIG. 5A is a cross-sectional view of the lateral PIN photodiode during a subsequent fabrication step in accordance with the present invention in which the circumferential edge of the p-contact metal is used to define the region of the diffusion island 104A to be removed by etching.
Figure 5B:
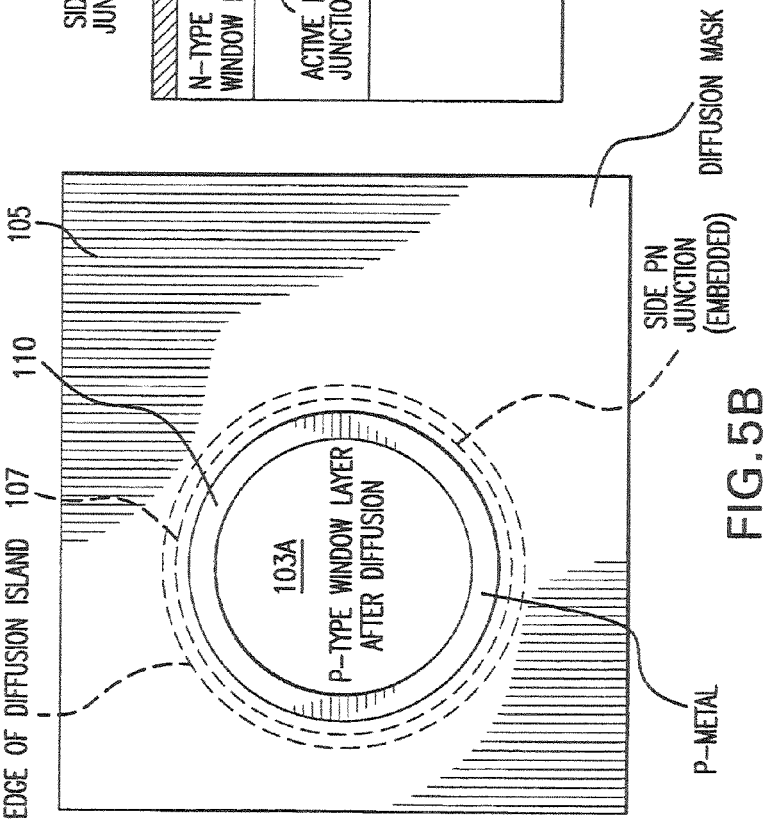
FIG. 5B is a top plan view of the lateral PIN photodiode of FIG. 5A.

FIG. 5A is a cross-sectional view of the lateral PIN photodiode during a subsequent fabrication step in accordance with the present invention in which the circumferential edge of the p-contact metal is used to define the region of the diffusion island 104A to be removed by etching;

FIG. 5B is a top plan view of the lateral PIN photodiode of FIG. 5A showing the exposed p-type window layer 103A after the diffusion island 104A has been removed.

Figure 6:
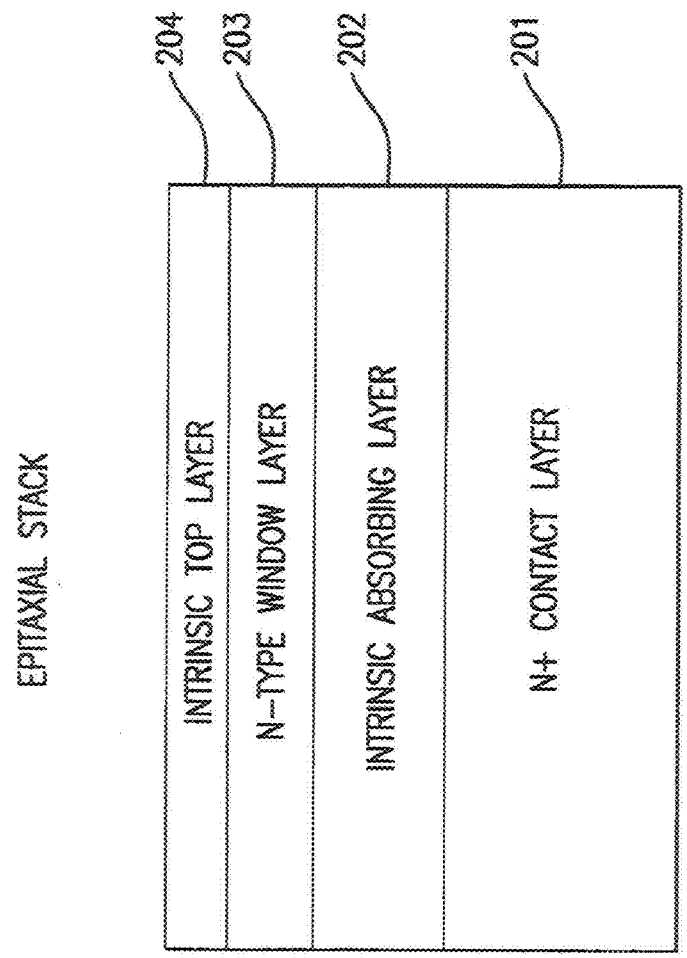
FIG. 6 is a cross-sectional view of the structure of the epitaxial stack of a lateral PIN photodiode construed in accordance with the prior art.

FIG. 6 is a cross-sectional view of the structure of the epitaxial stack of a lateral PIN photodiode construed in accordance with the prior art and used as the initial structure in the process according to the second embodiment of present invention. Similar to FIG. 1, there is shown a fragmentary, cross-sectional view of a semiconductor structure or epitaxial stack with generic first and second type electrodes. In particular, the photodiode structure includes an n+ contact layer 201 and an intrinsic absorbing layer 202 disposed on the n+ contact layer. An n-type window layer 203 is disposed on the absorbing layer 202, and an intrinsic layer 203 is disposed on the layer 203. The n+ and n– regions 201 and 203 respectively are normally doped to high carrier concentrations, while the intrinsic region 202 typically has a small, residual n-type carrier concentration.

FIG. 7A is a cross-sectional view of a lateral PIN photodiode in accordance with a second embodiment of the present invention representing a first step of the fabrication process. A diffusion mask 205 with a circular aperture 204A is applied over the surface of the semiconductor structure. Zn atoms are then diffused into the surface not covered by the mark.

FIG. 7B is a top plan view of the lateral PIN photodiode of FIG. 7A showing the circular diffusion area 204A defined by the diffusion mask 205 through which the Zn atoms are to be diffused.

FIG. 8A is a cross-sectional view of a lateral PIN photodiode of FIG. 7A representing the second fabrication step in accordance with the present invention after zn diffusion, and removal of the diffusion mask. A p-type window layer 203A is formed in the n-type window layer 203 below the diffusion aperture 204A. A PN junction is formed both on the side 207 of the p-type layer 203A, and on the bottom 206 of the layer in the intrinsic absorbing layer 206.

FIG. 8B is a top plan view of the lateral PIN photodiode of FIG. 8A depicting the diffused area below the diffusion aperture 204A.

In the steps that follow, a ring shaped mask is used to form a metal ring around the diffusion aperture 204A to make electrical contact to the p-type top layer 204A after the diffusion. A predetermined portion 204B of the intrinsic layer 204 outside of the ring is then etched down to a extent so that the portion 204B is surface depleted. The portion 204B serves as a passivation ledge covering the side PN junction 207 in the window layer under the intrinsic layer 204.

Figure 9A:
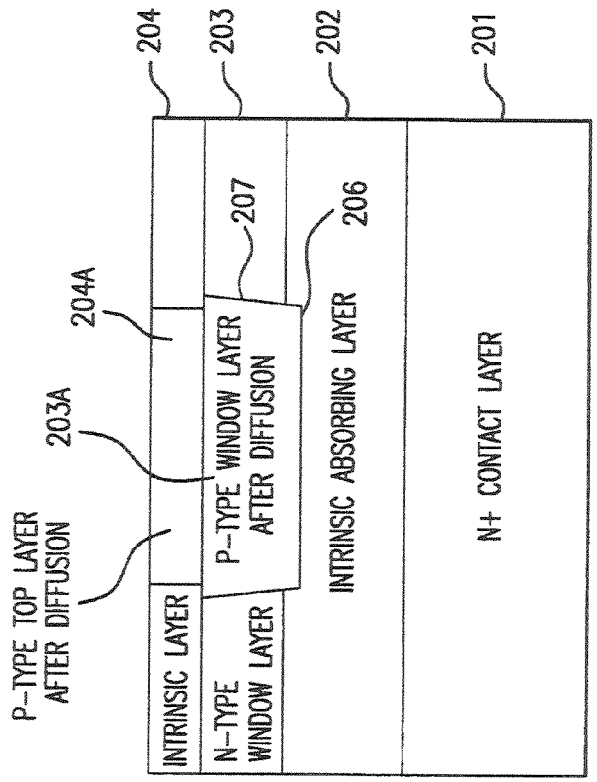
FIG. 9A is a cross-sectional view of the lateral PIN photodiode of FIG. 8A during a subsequent fabrication step in accordance with the present invention.

FIG. 9A is a cross-sectional view of the lateral PIN photodiode of FIG. 8A depicting a subsequent fabrication step in accordance with the present invention in which the diffusion mask 205 is removed, leaving the intrinsic layer 204 as the top surface of the semiconductor structure.

Figure 9B:
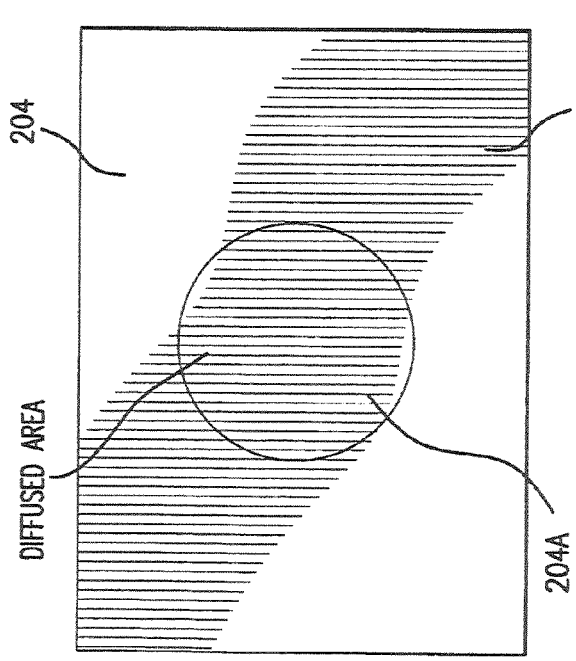
FIG. 9B is a top plan view of the lateral PIN photodiode of FIG. 9A.

FIG. 9B is a top plan view of the lateral PIN photodiode of FIG. 9A showing the top surface of the intrinsic layer 204, with a circular portion 204A of the intrinsic layer 204 which has been diffused.

Figures 10A, 10B:
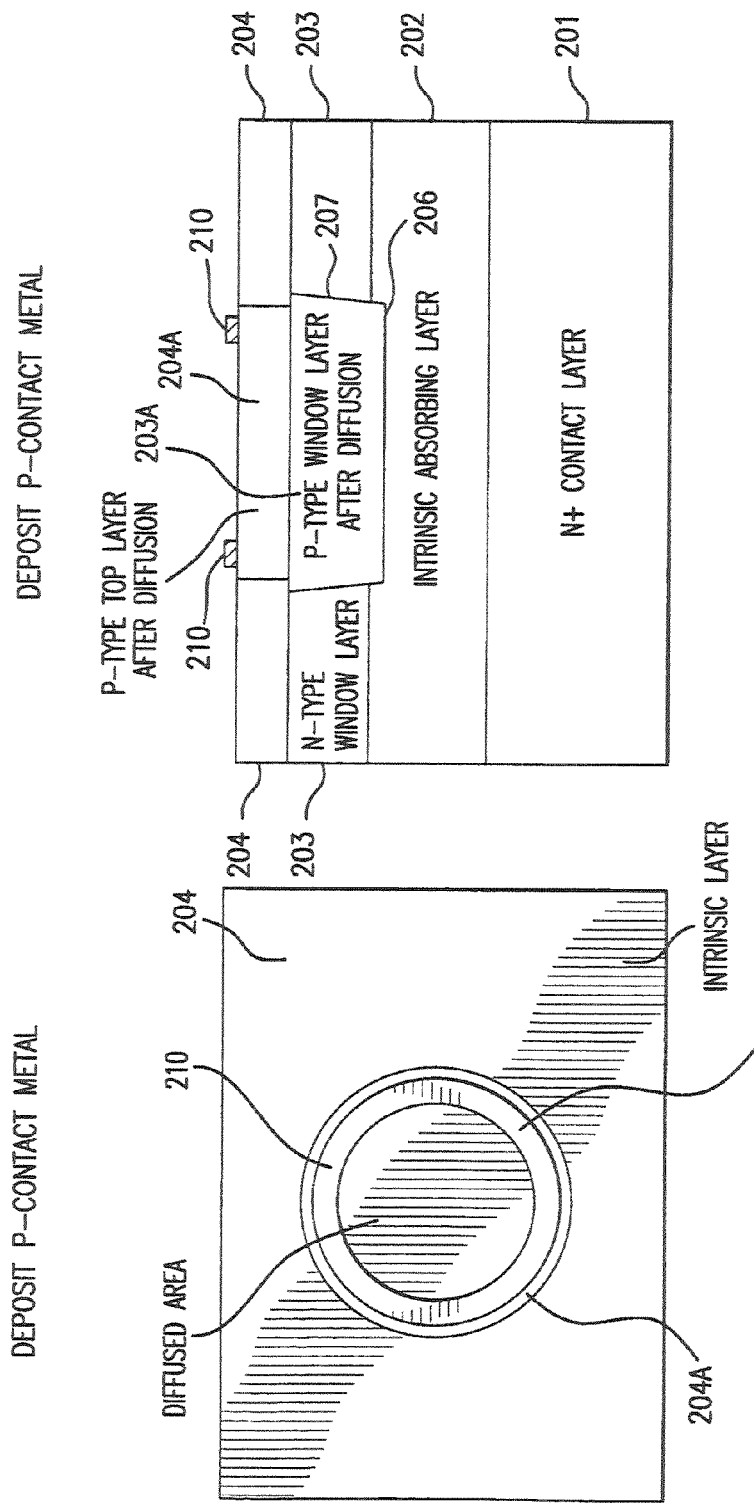
FIG. 10A is a cross-sectional view of the lateral PIN photodiode of FIG. 9A during a subsequent fabrication step in accordance with the present invention.
FIG. 10B is a top plan view of the lateral PIN photodiode of FIG. 10A during a subsequent processing step depicting the annular p-contact metal ring 210 overlying the circumferential edge position of the diffusion region 204A.

FIG. 10A is a cross-sectional view of the lateral PIN photodiode of FIG. 9A depicting a subsequent fabrication step in accordance with the present invention in which a p-contact metal ring region is lithographically defined and a contact metal 210 is deposited to form the p-type contact to the device.

FIG. 10B is a top plan view of the lateral PIN photodiode of FIG. 10A depicting the annular p-contact metal ring 210 overlying the diffused portion 204 but interior of the circumferential edge of the diffusion region 204A;

FIG. 11A is a cross-section view of the lateral PIN photodiode of FIG. 10A during a subsequent fabrication step in accordance with the present invention in which the outer circumferential edge of the p-contact metal ring 210 is used to define a ledge, and a portion of the intrinsic region 204 and 204A is subsequentially removed by etching, in particular leaving a thin surface depletion ledge 204B extending circumferentially around the p-metal contact ring 210.

FIG. 11B is a top plan view of the lateral PIN photodiode of FIG. 11A showing the p-metal contact ring 210 and the top surface of the surface depletion ledge after etching a portion of the layer 204. The side PN junction 207 is thereby protected without the use of a dielectric layer.

It will be understood that each of the elements described above, or two or more together, also may find a useful application in other types of constructions differing from the types described above.

While the invention has been illustrated and described as embodied in a device and method for making a PIN photodiode with a zinc diffusion region, it is not intended to be limited to the details shown, since various modifications and structural changes may be made without departing in any way from the spirit of the present invention.

Without further analysis, from the foregoing others can, by applying current knowledge, readily adapt the present invention for various applications. Such adaptations should, and are intended to, be comprehended within the meaning and range of equivalence of the following claims.

What is claimed is:

1. A PIN photodiode comprising:
   a substrate;
   a first-type semiconductor contact layer on the substrate;
   a first layer over the first-type semiconductor contact layer, the first layer comprising a first region of intrinsic material and a second region dopant, wherein the intrinsic material has a small, residual carrier concentration of the first type, and wherein the second region is doped second type and forms a PN junction with the first region;
   a second layer over the first layer, the second layer comprising a first type window layer and a second type window layer to form a PN junction with the first type window layer;
   a third layer over the second layer, the third layer comprising an aperture, a first inner ring portion, and a second outer ring portion circumferentially surrounding the aperture, wherein the second outer ring portion is thinner than the first inner ring portion and intrinsic material in the second outer ring portion is depleted; and a contact electrode over the second type window layer.

2. A PIN photodiode as defined in claim 1, wherein the contact electrode has an annular shape.

3. A PIN photodiode as defined in claim 1 wherein the aperture is thinner than the first inner ring portion.

4. A PIN photodiode as defined in claim 1 wherein the aperture is doped second type.

5. A PIN photodiode as defined in claim 1 wherein the first inner ring portion is doped second type.

6. A PIN photodiode as defined in claim 1 wherein the contact electrode is over the first inner ring portion.

7. A PIN photodiode as defined in claim 1 wherein the second outer ring portion circumferentially surrounds the first inner ring portion.

8. A photodiode comprising:

an semiconductor contact layer having a first type dopant;

an intrinsic layer on the semiconductor contact layer;

a first window layer on the intrinsic layer, the first window layer having the first type dopant;

a second window layer surrounded by the first window layer, the second window layer having a second type dopant and extending at least partially beneath the first window layer;

a ring portion on the second window layer, the ring portion having the second type dopant; and a depleted intrinsic region extending circumferentially around the ring portion.

9. A photodiode as defined in claim 8 further comprising an aperture region within an area defined by the ring portion.

10. A photodiode as defined in claim 9 wherein the aperture region comprises the second type dopant.

11. A photodiode as defined in claim 8 wherein the depleted intrinsic region is thinner than the ring portion.

12. A photodiode as defined in claim 8 further comprising an electrode on the ring portion.

* * * * *